United States Patent
Takebayashi

(10) Patent No.: US 10,332,774 B2
(45) Date of Patent: Jun. 25, 2019

(54) WAFER SUPPORT STRUCTURE

(71) Applicant: NGK INSULATORS, LTD., Nagoya (JP)

(72) Inventor: Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 269 days.

(21) Appl. No.: 15/335,839

(22) Filed: Oct. 27, 2016

(65) Prior Publication Data

US 2017/0047239 A1 Feb. 16, 2017

Related U.S. Application Data

(63) Continuation of application No. PCT/JP2016/050817, filed on Jan. 13, 2016.

(60) Provisional application No. 62/105,371, filed on Jan. 20, 2015.

(51) Int. Cl.
*H01L 21/683* (2006.01)
*H01L 21/687* (2006.01)

(52) U.S. Cl.
CPC .... *H01L 21/6833* (2013.01); *H01L 21/68771* (2013.01)

(58) Field of Classification Search
CPC ............ H01L 21/6833; H01L 21/68771
See application file for complete search history.

(56) References Cited

U.S. PATENT DOCUMENTS

| | | | |
|---|---|---|---|
| 6,558,508 B1 | 5/2003 | Kawakami | |
| 8,582,274 B2 * | 11/2013 | Kamimura | H01L 21/6831 361/234 |
| 2010/0055351 A1 | 3/2010 | Kato et al. | |
| 2012/0006489 A1 * | 1/2012 | Okita | H01L 21/67757 156/345.43 |
| 2013/0068727 A1 | 3/2013 | Okita et al. | |
| 2013/0155568 A1 | 6/2013 | Todorow et al. | |

(Continued)

FOREIGN PATENT DOCUMENTS

| | | |
|---|---|---|
| CN | 102939648 A | 2/2013 |
| CN | 104012185 A | 8/2014 |
| JP | H11-265931 A1 | 9/1999 |

(Continued)

OTHER PUBLICATIONS

English translation of International Preliminary Report on Patentability (Application No. PCT/JP2016/050817) dated Aug. 3, 2017.

(Continued)

*Primary Examiner* — Scott Bauer

(74) *Attorney, Agent, or Firm* — Burr & Brown, PLLC

(57) ABSTRACT

A wafer support structure includes a ceramic tray plate having a plurality of wafer placement portions in which wafers are placed, and arranged on an upper surface of a ceramic base plate. The base plate incorporates a base-side electrode, and the tray plate incorporates a tray-side electrode. In the wafer support structure, voltages applied to the base-side electrode and the tray-side electrode are adjusted in a state where the wafers are placed in the wafer placement portions. As a result, an electrostatic force acting to attract the base plate and the tray plate to each other is generated, and an electrostatic force acting to attract the tray plate and the wafers to each other is generated.

8 Claims, 5 Drawing Sheets

(56) References Cited

U.S. PATENT DOCUMENTS

2014/0253900 A1     9/2014   Cornelissen et al.
2015/0371885 A1*  12/2015   Tamagawa .......... H01L 21/6833
                                                        361/234

FOREIGN PATENT DOCUMENTS

| JP | 2003-124298 A1 | 4/2003 |
| JP | 2004-095665 A1 | 3/2004 |
| JP | 2010-059494 A1 | 3/2010 |
| JP | 2011114178 A * | 6/2011 |
| JP | 2014-534620 A1 | 12/2014 |
| KR | 10-2006-0112903 A | 11/2006 |
| WO | 2011/151996 A1 | 12/2011 |

OTHER PUBLICATIONS

Korean Office Action (Application No. 10-2016-7030451) dated Mar. 16, 2018 (with English translation).
International Search Report and Written Opinion (Application No. PCT/JP2016/050817) dated Mar. 22, 2016.

* cited by examiner

Related Art

WAFER SUPPORT STRUCTURE

BACKGROUND OF THE INVENTION

1. Field of the Invention

The present invention relates to a wafer support structure.

2. Description of the Related Art

There is so far known a wafer support structure including a plurality of wafer placement portions in which wafers are placed (see, e.g., Patent Literature (PTL) 1).

CITATION LIST

Patent Literature

PTL 1: Japanese Unexamined Patent Application Publication No. 2010-59494

SUMMARY OF THE INVENTION

FIG. 8 illustrates one of related-art wafer support structures of the above-mentioned type. In a wafer support structure 100 of FIG. 8, an $Al_2O_3$ plate 102 used for conveying wafers W and including a plurality of wafer placement portions 104 in which the wafers W are placed is arranged on an upper surface of an AlN electrostatic chuck 110. A plating layer 106 made of a conductive material (e.g., Ni) is formed on a rear surface of the $Al_2O_3$ plate 102 for conveying. Furthermore, a pair of positive and negative electrodes 112 and 114 is incorporated in the AlN electrostatic chuck 110. When DC voltages from DC power sources DC1 and DC2 are applied respectively to the electrodes 112 and 114 in a state where the wafers W are placed in the wafer placement portions 104, the Johnson-Rahbek force (JR force) is generated between the plating Layer 106 of the $Al_2O_3$ plate 102 for conveying and the AlN electrostatic chuck 110, and the $Al_2O_3$ plate 102 for conveying is attracted to the AlN electrostatic chuck 110. A surface of the wafer placement portion 104 (i.e., its surface in contact with the wafer W) is a ground surface. Moreover, embossed projections (not illustrated) are formed on a surface of the AlN electrostatic chuck 110, the surface being positioned to face the plating layer 106, and surfaces of the embossed projections (i.e., their surfaces in contact with the plating layer 106) are mirror surfaces.

In the wafer support structure of FIG. 8, however, contact thermal resistance between the wafer W and the surface of the wafer placement portion 104 is large because the wafer W is just simply placed in the wafer placement portion 104 of the $Al_2O_3$ plate 102 for conveying. For that reason, when plasma heat is input from above, a temperature of the wafer W becomes too high, or a variation in temperature distribution (difference between a highest temperature and a lowest temperature) of the wafer W becomes too large in some cases.

The present invention has been made in consideration of the problems described above, and a main object of the present invention is to avoid a wafer from undergoing a too high temperature or from causing a too large variation in temperature distribution.

Solution to Problem

A wafer support structure of the present invention includes a ceramic tray plate having a plurality of wafer placement portions in which wafers are placed, and arranged on an upper surface of a ceramic base plate, wherein the base plate incorporates a base-side electrode, the tray plate incorporates a tray-side electrode, and an electrostatic force acting to attract the base plate and the tray plate to each other is generated and an electrostatic force acting to attract the tray plate and the wafers to each other is generated by adjusting voltages applied to the base-side electrode and the tray-side electrode in a state where the wafers are placed in the wafer placement portions.

In the wafer support structure described above, electrostatic forces (attraction forces) are generated between the base plate and the tray plate and between the tray plate and the wafers by adjusting voltages applied to the base-side electrode and the tray-side electrode in the state where the wafers are placed in the wafer placement portions. As a result, contact thermal resistance between the wafer and the wafer placement portion becomes smaller than that in the case where no attraction force is generated between the wafer and the wafer placement portion. It is hence possible to avoid the wafer from undergoing a too high temperature or from causing a too large variation in temperature distribution.

In the wafer support structure of the present invention, the tray plate may include a metal layer on a surface thereof positioned to face the base plate, and an electrostatic force acting to attract the base plate and the metal layer of the tray plate to each other may be generated and an electrostatic force acting to attract the tray plate and the wafers to each other may be generated by applying voltages to both the base-side electrode and the tray-side electrode in the state where the wafers are placed in the wafer placement portions. Alternatively, the tray plate may not include a metal layer on the surface thereof positioned to face the base plate, and an electrostatic force acting to attract the base plate and the tray plate to each other may be generated and an electrostatic force acting to attract the tray plate and the wafers to each other may be generated by applying a voltage to the tray-side electrode in the state where the wafers are placed in the wafer placement portions.

In the wafer support structure of the present invention a surface of the wafer placement portion in contact with the wafer may be a flat mirror surface. With that feature, a contact area between the wafer and the wafer placement portion is larger than that in the case where the surface of the wafer placement portion in contact with the wafer is a ground surface. Hence the advantageous effect of the present invention is more significant.

In the wafer support structure of the present invention, the tray plate may be made of $Al_2O_3$, and the base plate may be made of AlN.

In the wafer support structure of the present invention, the tray-side electrode may have a bipolar configuration including a negative electrode and a positive electrode, and an area ratio of the negative electrode to the positive electrode in each wafer placement portion may be 0.7 to 1:0.7 to 1 (preferably 0.9 to 1:0.9 to 1). With that feature, the wafer is less apt, to bring about a region where the attraction force is relatively strong and a region where the attraction force is relatively weak. Hence a variation in temperature distribution of the wafer can be reduced.

DETAILED DESCRIPTION OF THE INVENTION

First Embodiment

Figure 1:
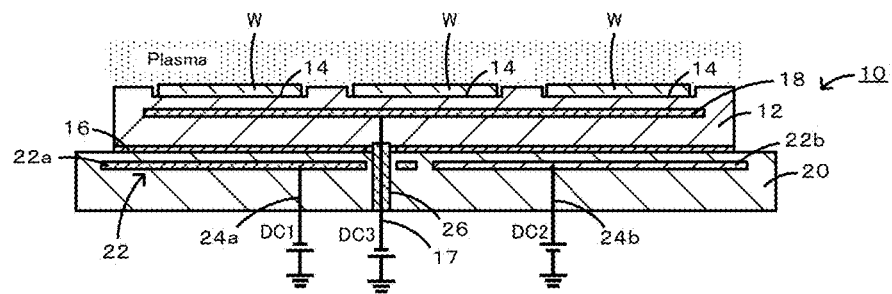
FIG. 1 is a vertical sectional view of a wafer support structure 10 of a first embodiment.
Figure 2:
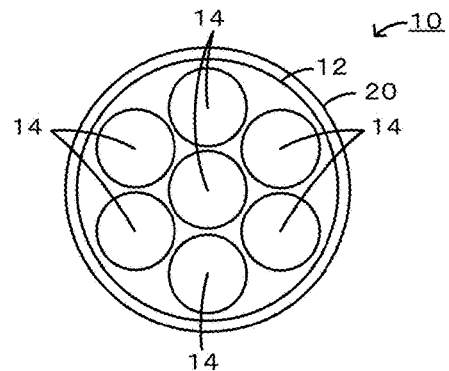
FIG. 2 is a plan view of the wafer support structure 10 of the first embodiment.

One example of a wafer support structure according to the present invention will be described below with reference to FIGS. 1 and 2. FIG. 1 is a vertical sectional view of a wafer support structure 10 of a first embodiment, and FIG. 2 is a plan view of the wafer support structure 10.

The wafer support structure 10 is used to support a wafer W on which CVD, etching, etc. are carried out by employing plasma. The wafer support structure 10 is mounted inside a chamber (not illustrated) for a semiconductor process.

In the wafer support structure 10, a tray plate 12 made of ceramic ($Al_2O_3$ in this embodiment) and including a plurality of wafer placement portions 14 in which the wafers W are placed is arranged on an upper surface of a base plate 20 made of ceramic (AlN in this embodiment).

The tray plate 12 is a disk-shaped plate used to convey the wafers W, and it includes the plurality of wafer placement portions 14 in its upper surface. The wafer placement portions 14 are each in the shape of a circular recess when viewed from above, and are each formed in a size slightly larger than that of the disk-shaped wafer W. In this embodiment, the wafer placement portions 14 are formed seven in total, i.e., one at a center when looking at the tray plate 12 from above and six arranged at angular intervals of 60° along a concentric circle to the circumference of the tray plate 12 (see FIG. 2). A surface of each wafer placement portion 14, i.e., its surface in contact with the wafer W, is finished to a flat mirror surface. A plating layer 16 made of a conductive material (e.g., Ni) is formed on a rear surface of the tray plate 12, i.e., on its surface being positioned to face the base plate 20. The tray plate 12 incorporates a disk-shaped tray-side electrode 18. The tray-side electrode 18 is embedded inside the tray plate 12 at a position spaced from the surface of the wafer placement portion 14 through 0.35±0.05 mm. A power feed pin 17 for the tray-side electrode 18 is disposed to extend from a lower surface of the base plate 20 through the base plate 20 and to reach the tray-side electrode 18. A tip of the power feed pin 17 may have a flat surface or a curved surface (spherical surface).

The base plate 20 is a disk-shaped plate, and it incorporates a base-side electrode 22. The base-side electrode 22 is constituted by a comb-teeth negative electrode 22a and a comb-teeth positive electrode 22b, of which comb teeth are arranged to be interdigitated while they are kept in a non-contact state. An area ratio of the comb-teeth negative electrode 22a to the comb-teeth positive electrode 22b is 0.7 to 1:0.7 to 1. The base-side electrode 22 is embedded in the base plate 20 at a position spaced from its upper surface through 1±0.5 mm. A plurality of embossed projections (not illustrated) is formed on the upper surface of the base plate 20, i.e., on its surface positioned to face the tray plate 12. Surfaces of those embossed projections (i.e., their surfaces in contact with the plating layer 16) are finished into mirror surfaces. The base plate 20 includes a power feed pin 24a extending from its lower surface until reaching the comb-teeth negative electrode 22a, and a power feed pin 24b extending from its lower surface until reaching the comb-teeth positive electrode 22b. Furthermore, an insulation sleeve 26 is disposed in the base plate 20 to penetrate therethrough in an up-down direction. The power feed pin 17 for the tray-side electrode 18 is inserted through the insulation sleeve 26. The power feed pin 17 is biased by an elastic body (not illustrated), which is disposed within the insulation sleeve 26, in a way of adjusting a contact load applied to the tray-side electrode 18 to be kept at 200 g. The tray-side electrode 18 and the base-side electrode 22 may be each formed by printing, or by embedding a mesh.

An example of use of the wafer support structure 10 of this embodiment will be described below. First, the wafers W are placed respectively in the wafer placement portions 14. Then, the voltages from DC power sources DC1 and DC2 are applied to the power feed pins 24a and 24b, respectively, while a voltage from a DC power source DC3 is applied to the power feed 17. In addition, a high-frequency voltage is applied to parallel plates (not illustrated) to generate plasma above the wafers W. The plasma serves as a ground electrode for the wafers W. As a result, the JR force is generated between the base-side electrode 22 and the plating layer 16 of the tray plate 12, and the Coulomb's force is generated between the tray-side electrode 18 and each wafer W. In that state, CVD film formation, etching, etc. are carried out on the wafers W by utilizing the plasma.

With the wafer support structure 10 described in detail above, contact thermal resistance between the wafer W and the wafer placement portion 14 is smaller than that in the case where no attraction force is generated between the wafer W and the wafer placement portion 14. Therefore, the wafer W can be avoided from undergoing a too high temperature or from causing a too large variation in temperature distribution when the wafer W is heated from above. Moreover, since the surface of the wafer placement portion 14 in contact with the wafer W is a flat mirror surface, a contact area between the wafer W and the wafer placement portion 14 is larger than that in the case where the relevant surface of the wafer placement portion 14 is a ground surface. Hence the advantageous effect of the present invention is more significant.

Second Embodiment

Figure 3:
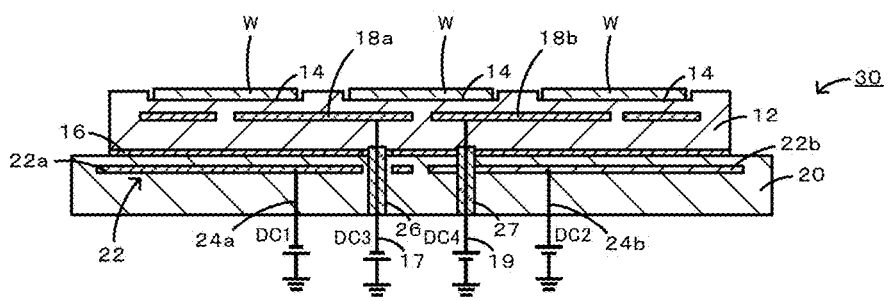
FIG. 3 is a vertical sectional view of a wafer support structure 30 of a second embodiment.
Figure 4:
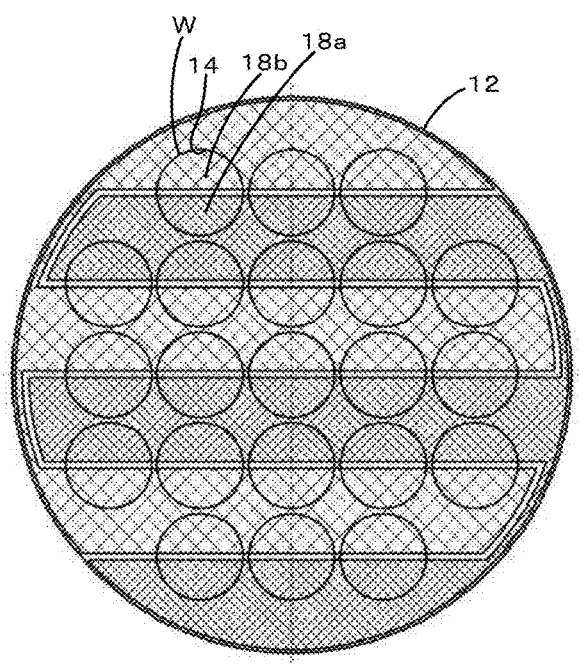
FIG. 4 is a perspective view illustrating One example of a negative electrode 18a and a positive electrode 18b, which cooperatively constitute a tray-side electrode in the second embodiment, when viewed from above.
Figure 5:
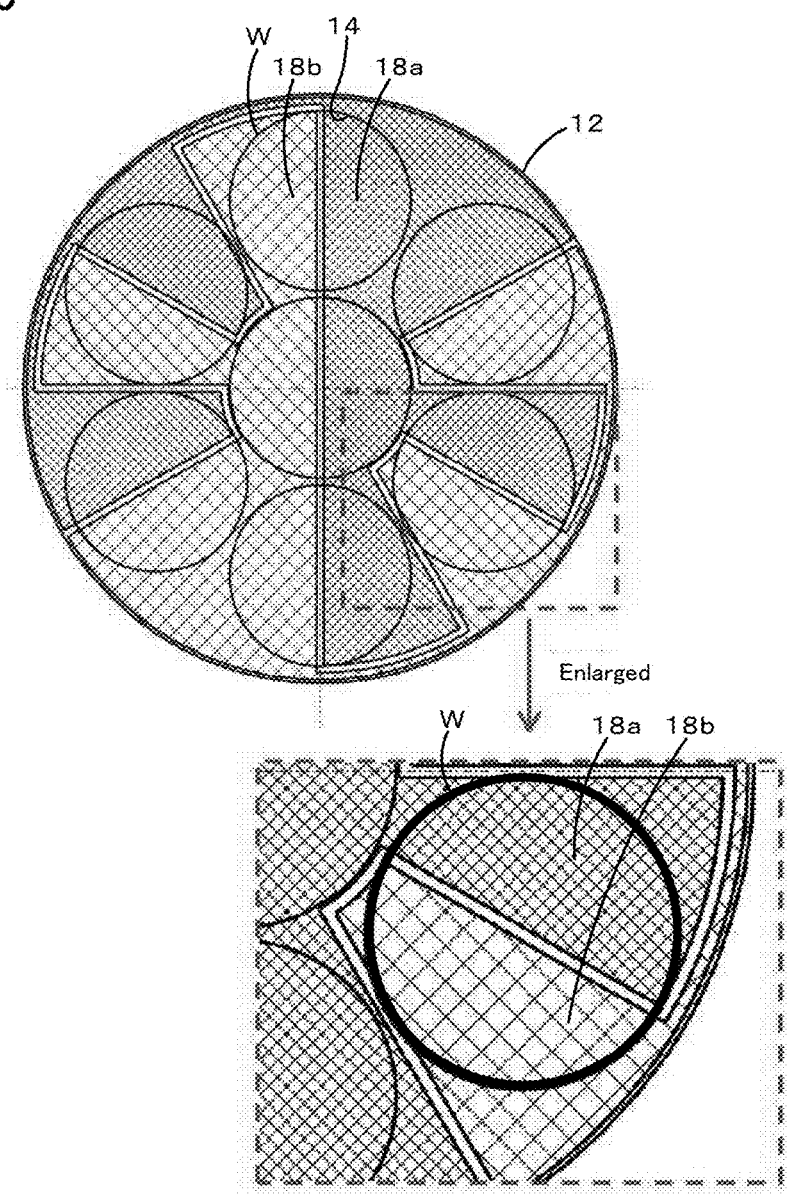
FIG. 5 is a perspective view illustrating one example of a negative electrode 18a and a positive electrode 18b, which cooperatively constitute a tray-side electrode in the second embodiment, when viewed from above.
Figure 6:
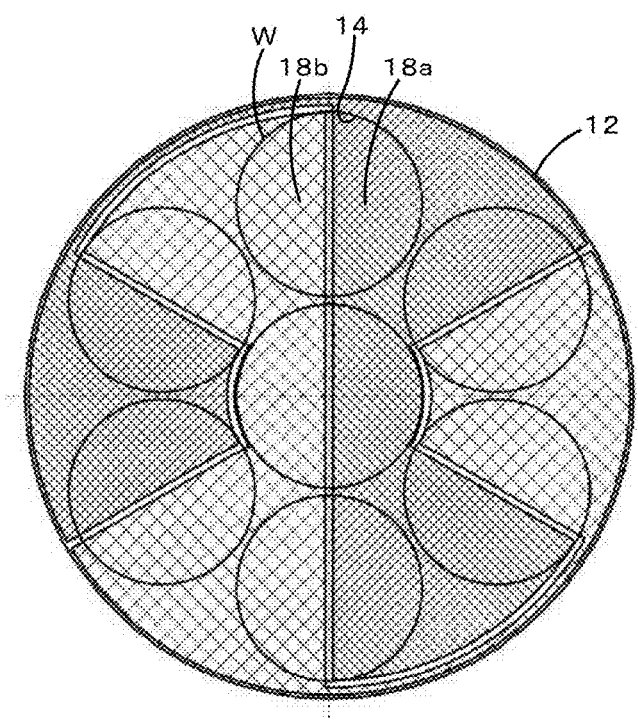
FIG. 6 is a perspective view illustrating one example of a negative electrode 18a and a positive electrode 18b, which cooperatively constitute a tray-side electrode in the second embodiment, when viewed from above.

A wafer support structure 30 according to a second embodiment is similar to the wafer support structure 10 except for that the structure of a tray-side electrode of the tray plate 12 is modified, as illustrated in FIG. 3. More specifically, in the wafer support structure 30, the tray-side electrode incorporated inside the tray plate 12 is constituted by a negative electrode 18a and a positive electrode 18b each having a zigzag shape. The negative electrode 18a and the positive electrode 18b are arranged to be interdigitated while they are kept in a non-contact state. The power feed pin 17 is connected to the negative electrode 18a, and a power feed pin 19 is connected to the positive electrode 18b. The power feed pin 19 is inserted through an insulating sleeve 27 that penetrates through the base plate 20. Moreover, voltages from DC power sources. DC3 and DC4 are applied to the power feed pins 17 and 19, respectively. Here, FIGS. 4 to 6 are each a perspective view when looking at the tray plate 12 from above. FIG. 4 represents an example in which twenty-one wafers W each having a 2-inch size are placed on the tray plate 12, and FIGS. 5 and 6 each represent an example in which seven wafers W each having a 4-inch size are placed on the tray plate 12. In each of FIGS. 4 to 6, the negative electrode 18a is denoted by a fine mesh, and the positive electrode 18b is denoted by a rough mesh. The spacing between the negative electrode 18a and the positive electrode 18b is preferably set to be 2 to 6 mm, for example, though not being limited to a particular value. Furthermore, the distance between an electrode end (outer peripheral end) of the tray-side electrode 18 and the tray plate 12 is preferably set to be 1 to 4 mm, for example, though not being limited to a particular value. In any of FIGS. 4 to 6, an area ratio of the negative electrode 18a to the positive electrode 18b is set to be 0.7 to 1:0.7 to 1 (1:1 in FIGS. 4 to 6) when looking at one wafer W. In use of the wafer support structure 30, first, the wafers W are placed respectively in the wafer placement portions 14. Then, the voltages from DC power sources DC1 and DC2 are applied to the power feed pins 24a and 24b, respectively, while the voltages from DC power sources DC3 and DC4 are applied to the power feed pins 17 and 19, respectively. In addition, a high-frequency voltage is applied to parallel plates (not illustrated) to generate plasma above the wafers W. As a result, the JR force is generated between the base-side electrode 22 and the plating layer 16 of the tray plate 12, and the Coulomb's force is generated between the tray-side electrode (the negative electrode 18a or the positive electrode 18b) and each wafer W. Thus, a similar advantageous effect to that in the wafer support structure 10 is obtained. In addition, since the area ratio of the negative electrode 18a to the positive electrode lab is set to be 0.7 to 1:0.7 to 1 when looking at one wafer W, each wafer W is less apt to bring about a region where the attraction force is relatively strong and a region where the attraction force is relatively weak. Hence a variation in temperature distribution of the wafer W can be reduced.

Third Embodiment

Figure 7:
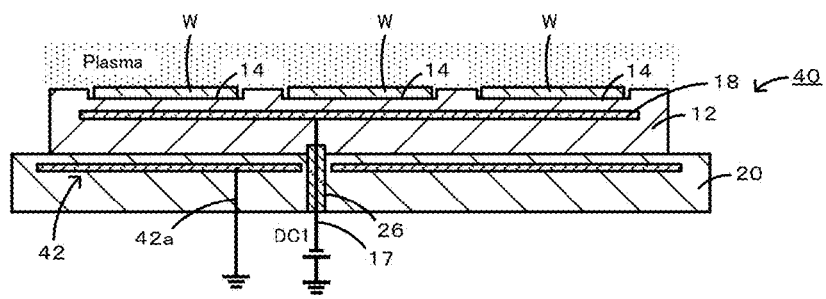
FIG. 7 is a vertical sectional view of a wafer support structure 40 of a third embodiment.
Figure 8:
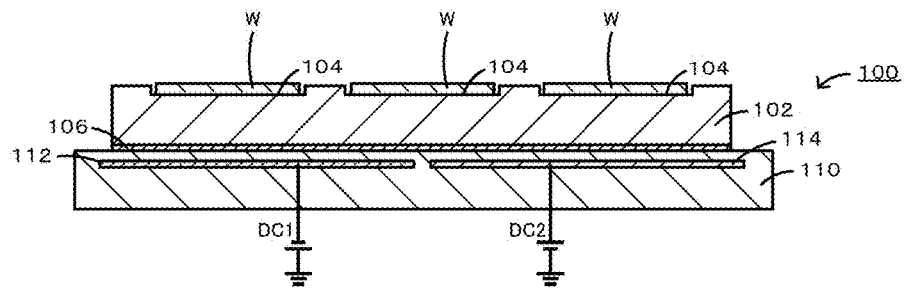
FIG. 8 is a vertical sectional view of a conventional wafer support structure 100.

A wafer support structure 40 according to a third embodiment is similar to the wafer support structure 10 except for that the plating layer 16 of the tray plate 12 is not formed and the structure of a base-side electrode of the base plate 20 is modified, as illustrated in FIG. 7. More specifically, in the Wafer support structure 40, the tray plate 12 is directly mounted on the base plate 20 without forming the plating layer 16 on the lower surface of the tray plate 12. Furthermore, a base-side electrode 42 of the base plate 20 is constituted as one disk-shaped electrode and is grounded through a ground pin 42a. The base-side electrode 42 is arranged inside the base plate 20 at a position spaced from its upper surface through 0.5±3 mm. The tray-side electrode 18 is arranged inside the tray plate 12 at a position spaced from each of the surface of the wafer placement portion 14 and the lower surface of the tray plate 12 through 0.35±0.05 mm. In use of the wafer support structure 40, first, the wafers W are placed respectively in the wafer placement portions 14. Then, a voltage from a DC power source DC1 is applied to the power feed pin 17. In addition, a high-frequency voltage is applied to parallel plates (not illustrated) to generate plasma above the wafers W. The plasma serves as a ground electrode for the wafers W. As a result, the Coulomb's force is generated between the base-side electrode 42 and the tray-side electrode 18, and the Coulomb's force is further generated between the tray-side electrode 18 and each wafer W. Thus, a similar advantageous effect to that in the wafer support structure 10 is obtained. The volume resistivity of the tray plate 12 at an operating temperature is preferably set to be $1\times10^{15}$ Ωcm or more.

The present invention is not limited to the above-described embodiment, and can be carried out by various modes as long as they belong to the technical scope of the invention.

EXAMPLES

A temperature and a temperature distribution of the wafer W in the case of generating a plasma heat input were measured for each of not only the wafer support structures 10, 30 and 40 according to the first to third embodiments, but also the wafer support structure 100 of the related art.

In the wafer support structure 10, −500 V, +500 V and −2.5 kV were applied respectively from the DC power sources DC1, DC2 and DC3. In the wafer support structure 30, −500 V, +500 V, −2.5 kV and +2.5 kV were applied respectively from the DC power sources DC1, DC2, DC3 and DC4. In the wafer support structure 40, −2.5 kV was applied from the DC power source DC1. In the wafer support structure 100, −500 V and +500 V were applied respectively from the DC power sources DC1 and DC2. In states where the voltages were applied as mentioned above, the plasma heat input was set to 1 kW and the temperature of the base plate 20 was controlled to be held at 40° C. in each of the wafer support structures 10, 30, 40 and 100. An aluminum cooling plate was attached to the lower surface of the base plate 20, and a coolant was circulated inside the aluminum cooling plate. An average value of temperatures of the seven wafers W placed in the Wafer placement portions 14 of the tray plate 12 and a maximum value among variations in temperature distribution (among differences between the highest temperature and the lowest temperature) of the wafers W were measured. The measured results are listed in Table 1. As seen from Table 1, the temperature of the wafer W can be reduced and the variation in temperature distribution of the wafer W can be held smaller in the wafer support structures 10, 30 and 40 according to the first to third embodiments in comparison with the wafer support structure 100 of the related art.

TABLE 1

| Wafer support structure | Attraction force between wafer and tray plate | Attraction force between tray plate and base plate | Temperature of wafer | Temperature distribution of wafer |
| --- | --- | --- | --- | --- |
| 10 | 14.4 kPa | 10.6 kPa | 67° C. | 2.8° C. |
| 30 | 14.3 kPa | 11.0 kPa | 68° C. | 3.0° C. |
| 40 | 14.3 kPa | 10.5 kPa | 70° C. | 2.8° C. |
| 100 | 0 Pa | >10 kPa | >300° C. | 70° C. |

The present application claims priority from U.S. provisional Patent Application No. 62/105,371 filed on Jan. 20, 2015, the entire contents of which are incorporated herein by reference.

It is needless to say that the present invention is in no way limited by EXAMPLES described above.

What is claimed is:

1. A wafer support structure including a ceramic tray plate having a plurality of wafer placement portions in which wafers are placed, and arranged on an upper surface of a ceramic base plate,
wherein the base plate incorporates a base-side electrode, the tray plate incorporates a tray-side electrode, and
an electrostatic force acting to attract the base plate and the tray plate to each other is generated and an electrostatic force acting to attract the tray plate and the wafers to each other is generated by adjusting voltages applied to the base-side electrode and the tray-side electrode in a state where the wafers are placed in the wafer placement portions, wherein the tray-side electrode has a bipolar configuration that includes a negative electrode and a positive electrode, with the negative electrode overlapping each wafer placement portion, and the positive electrode overlapping each wafer placement portion separately from the negative electrode in a plan view.

2. The wafer support structure according to claim 1, wherein the tray plate includes a metal layer on a surface thereof positioned to face the base plate, and
an electrostatic force acting to attract the base plate and the metal layer of the tray plate to each other is generated and an electrostatic force acting to attract the tray plate and the wafers to each other is generated by applying voltages to the base-side electrode and the negative electrode and the positive electrode of the tray-side electrode in the state where the wafers are placed in the wafer placement portions.

3. The wafer support structure according to claim 1, wherein the tray plate does not include a metal layer on a surface thereof positioned to face the base plate, and
an electrostatic force acting to attract the base plate and the tray plate to each other is generated and an electrostatic force acting to attract the tray plate and the wafers to each other is generated by applying a voltage to the negative electrode and the positive electrode of the tray-side electrode in the state where the wafers are placed in the wafer placement portions.

4. The wafer support structure according to claim 1, wherein the negative electrode and the positive electrode of the tray-side electrode are embedded at a position spaced from a surface of the wafer placement portion through 0.35±0.05 mm.

5. The wafer support structure according to claim 1, wherein the base-side electrode is embedded at a position spaced from an upper surface of the base plate through 1±0.5 mm.

6. The wafer support structure according to claim 1, wherein insulation sleeves are disposed in the base plate to penetrate therethrough and the negative electrode and the positive electrode of the tray-side electrode are fed with power feed pins which are inserted through the insulation sleeves.

7. The wafer support structure according to claim 1, wherein the tray plate is made of $Al_2O_3$, and
the base plate is made of AlN.

8. The wafer support structure according to claim 1, wherein an area ratio of the negative electrode to the positive electrode in each wafer placement portion is 0.7 to 1:0.7 to 1.

* * * * *